(12) United States Patent
Vopat et al.

(10) Patent No.: US 9,145,271 B2
(45) Date of Patent: Sep. 29, 2015

(54) OPTIMIZATION OF CONVEYOR BELTS USED FOR WORKPIECE PROCESSING

(71) Applicant: Varian Semiconductor Equipment Associates, Inc., Gloucester, MA (US)

(72) Inventors: Robert Brent Vopat, Austin, TX (US); Malcolm N. Daniel, Austin, TX (US); Luke Bonecutter, Cedar Park, TX (US); Jason M. Schaller, Austin, TX (US); Charles T. Carlson, Cedar Park, TX (US); William T. Weaver, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 188 days.

(21) Appl. No.: 14/018,887

(22) Filed: Sep. 5, 2013

(65) Prior Publication Data

US 2014/0076688 A1  Mar. 20, 2014

Related U.S. Application Data

(60) Provisional application No. 61/702,361, filed on Sep. 18, 2012.

(51) Int. Cl.
*B65G 47/52* (2006.01)
*B65G 43/10* (2006.01)
*H01L 21/67* (2006.01)
*H01L 21/677* (2006.01)

(52) U.S. Cl.
CPC ............. *B65G 47/52* (2013.01); *B65G 43/10* (2013.01); *H01L 21/67276* (2013.01); *H01L 21/67727* (2013.01)

(58) Field of Classification Search
CPC ........ B65G 43/00; B65G 43/08; B65G 43/10; B65G 47/52; B65G 2201/0297; H01L 21/67276; H01L 21/67727; H01L 21/6776; H01L 21/67745; H01L 21/77786
USPC ...................................... 198/346.1
See application file for complete search history.

(56) References Cited

U.S. PATENT DOCUMENTS 6,854,583 B1 * 2/2005 Horn .............................. 198/348
7,058,468 B2 * 6/2006 Ohtani et al. .................. 700/112

(Continued)

FOREIGN PATENT DOCUMENTS

WO   2007/051070 A2   5/2007
WO   2010/074366 A1   7/2010

OTHER PUBLICATIONS

International Search Report and Written Opinion mailed Apr. 10, 2014 for PCT/US2013/058879 filed Sep. 10, 2013.

*Primary Examiner* — Leslie A Nicholson, III
*Assistant Examiner* — Keith R Campbell

(57) ABSTRACT

A system and method for the handling of workpieces in a workpiece processing system is disclosed. The system utilizes three conveyor belts, where one may be a loading belt, feeding unprocessed workpieces from its associated workpiece carrier to a processing system. A second conveyor belt may be an unloading belt, receiving processed workpieces from the processing system and filling its associated workpiece carrier. The third conveyor belt may be exchanging its workpiece carrier during this time, so that it is available to start operating as the loading belt once all of the workpieces have been removed from the workpiece carrier associated with the first conveyor belt.

12 Claims, 16 Drawing Sheets

(56) References Cited

U.S. PATENT DOCUMENTS

| | | |
|---|---|---|
| 7,663,731 B2 * | 2/2010 | Cho .............................. 349/187 |
| 2008/0156618 A1 * | 7/2008 | Brain ......................... 198/349.6 |
| 2009/0000908 A1 * | 1/2009 | Brain et al. ................. 198/349.6 |
| 2012/0227233 A1 * | 9/2012 | Daniel et al. ................ 29/407.01 |
| 2014/0081443 A1 * | 3/2014 | Bando et al. ................... 700/112 |

* cited by examiner

| Step # | Conveyor Belt 104/ Indexer 101 | Conveyor Belt 105/ Indexer 102 | Conveyor Belt 106/ Indexer 103 |
|---|---|---|---|
| 1 | Loading Belt 1 | Idle; Full – Unprocessed 2 | Unloading Belt 1 |
| 2 | Unloading Belt 2 | Loading Belt 2 | Idle; Full – Processed 1 |
| 3 | Unloading Belt 2 | Loading Belt 2 | Idle; Exchanging Carrier |
| 4 | Unloading Belt 2 | Loading Belt 2 | Idle; Full – Unprocessed 3 |
| 5 | Idle; Full – Processed 2 | Unloading Belt 3 | Loading Belt 3 |
| 6 | Idle; Exchanging Carrier | Unloading Belt 3 | Loading Belt 3 |
| 7 | Idle; Full –Unprocessed 4 | Unloading Belt 3 | Loading Belt 3 |
| 8 | Loading Belt 4 | Idle; Full – Processed 3 | Unloading Belt 4 |
| 9 | Loading Belt 4 | Idle; Exchanging Carrier | Unloading Belt 4 |
| 10 | Loading Belt 4 | Idle; Full – Unprocessed 5 | Unloading Belt 4 |

FIG. 16

OPTIMIZATION OF CONVEYOR BELTS USED FOR WORKPIECE PROCESSING

This application claims priority of U.S. Provisional Patent Application Ser. No. 61/702,361, filed Sep. 18, 2012, the disclosure of which is incorporated herein by reference in its entirety.

FIELD

This invention relates to workpiece processing and, more particularly, to conveyor belts used for workpiece processing.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Two concerns of the solar cell manufacturing industry are manufacturing throughput and cell efficiency. Cell efficiency measures the amount of energy converted into electricity. Higher cell efficiencies may be needed to stay competitive in the solar cell manufacturing industry. However, manufacturing throughput cannot be sacrificed at the expense of increased cell efficiency.

Ion implantation has been demonstrated as a viable method to dope solar cells. Use of ion implantation removes process steps needed for existing technology, such as diffusion furnaces. For example, a laser edge isolation step may be removed if ion implantation is used instead of furnace diffusion because ion implantation will only dope the desired surface. Besides removal of process steps, higher cell efficiencies have been demonstrated using ion implantation. Ion implantation also offers the ability to perform a blanket implant of an entire surface of a solar cell or a selective (or patterned) implant of only part of the solar cell. Selective implantation at high throughputs using ion implantation avoids the costly and time-consuming lithography or patterning steps used for furnace diffusion. Selective implantation also enables new solar cell designs. Any improvement to manufacturing throughput of an ion implanter or its reliability would be beneficial to solar cell manufacturers worldwide. This may accelerate the adoption of solar cells as an alternative energy source.

SUMMARY

A system and method for the handling of workpieces in a workpiece processing system is disclosed. The system utilizes three conveyor belts, where one may be a loading belt, feeding unprocessed workpieces from its associated workpiece carrier to a processing system. A second conveyor belt may be an unloading belt, receiving processed workpieces from the processing system and filling its associated workpiece carrier. The third conveyor belt may be exchanging its workpiece carrier during this time, so that it is available to start operating as the loading belt once all of the workpieces have been removed from the workpiece carrier associated with the first conveyor belt.

According to one embodiment, a workpiece handling system is disclosed. The workpiece handling system comprises three conveyer belts; three indexers, each associated with a respective conveyor belt, each adapted to hold a workpiece carrier; and a stocker robot to exchange a workpiece carrier disposed on one of the indexers; wherein a direction of travel for each of the three conveyor belts can be changed, allowing each of the conveyor belts to operate, at different times, as a loading belt and as a unloading belt.

According to a second embodiment, a method of handling workpieces is disclosed. The method comprises placing a first workpiece carrier, filled with a first set of unprocessed workpieces, on a first indexer associated with a first conveyor belt; placing a second workpiece carrier, filled with a second set of unprocessed workpieces, on a second indexer associated with a second conveyor belt; removing the first set of workpieces from the first workpiece carrier and placing them on the first conveyor belt, where they are loaded into a processing system at a distal end of the first conveyor belt; receiving the first set of workpieces from the processing system at a distal end of the third conveyor belt; moving the first set of workpieces to the third indexer; filling a third workpiece carrier, disposed on a third indexer associated with the third conveyor belt, with the first set of workpieces; reversing a direction of travel of the first conveyor belt once a last workpiece has been removed from the first conveyor belt by the processing system; removing the second set of workpieces from the second workpiece carrier and placing them on the second conveyor belt, where they are loaded into the processing system at a distal end of the second conveyor belt; receiving the second set of workpieces from the processing system at a distal end of the first conveyor belt; moving the second set of workpieces to the indexer associated with the first conveyor belt; and filling the first workpiece carrier with the second set of workpieces.

According to a third embodiment, a workpiece handling system is disclosed. The workpiece handling system comprises first, second and third conveyor belts; three indexers, each associated with a respective conveyor belt, each adapted to hold a workpiece carrier; and a stocker robot to exchange a workpiece carrier disposed on one of the indexers; and a controller in communication with the conveyor belts, indexers and stocker robot, comprising a storage element comprising instructions which, when executed, actuate the stocker robot to place a first workpiece carrier, filled with a first set of unprocessed workpieces, on a first indexer associated with the first conveyor belt; actuate the stocker robot to place a second workpiece carrier, filled with a second set of unprocessed workpieces, on a second indexer associated with the second conveyor belt; actuate the first conveyor belt in a direction of travel so as to operate as a loading belt; actuate the indexer to remove the first set of workpieces from the first workpiece carrier and place them on the first conveyor belt, where they are loaded into a processing system at a distal end of the first conveyor belt; actuate the third conveyor belt in a direction of travel so as to operate as an unloading belt; receive the first set of workpieces from the processing system at a distal end of the third conveyor belt while the third conveyor belt is operating as an unloading belt; actuate a third indexer associated with the third conveyor belt, to fill a third workpiece carrier, disposed on the third indexer, with the first set of workpieces; reverse a direction of travel of the first conveyor belt once a last workpiece has been removed from the first conveyor belt by the processing system so as to operate as an unloading belt; actuate the second conveyor belt in a direction of travel so as to operate as a loading belt; actuate the second indexer to remove the second set of workpieces from the second workpiece carrier and place them on the second conveyor belt, where they are loaded into the processing system at a distal end of the second conveyor belt;

receive the second set of workpieces from the processing system at a distal end of the first conveyor belt while the first conveyor belt is operating as an unloading belt; and actuate the first indexer to fill the first workpiece carrier with the second set of workpieces.

BRIEF DESCRIPTION OF THE DRAWINGS

For a better understanding of the present disclosure, reference is made to the accompanying drawings, which are incorporated herein by reference and in which:

FIG. 16 illustrates a chart showing the sequence of action performed by the workpiece handing system according to one embodiment.

DETAILED DESCRIPTION

The workpiece handling system is described herein in connection with an ion implanter. However, the workpiece handling system can be used with other systems and processes involved in solar cell or semiconductor manufacturing or other systems that process workpieces. Thus, the invention is not limited to the specific embodiments described below.

For many workpieces, such as solar cells, one goal of a workpiece handling system is maintaining a high throughput. Having a dedicated load conveyor belt and a dedicated unload conveyor belt may require that workpiece carriers be moved from the load conveyor belt to the unload conveyor belt. This enables the empty workpiece carrier (or "cassette") to be used for processed workpieces, but may require extra movement, which lowers throughput.

In the embodiments disclosed herein, each conveyor belt can function in both a load and unload manner. This avoids moving the workpiece carrier to different locations for loading and unloading of workpieces, which saves idle time on the conveyor belt. For example, if a workpiece carrier can hold 100 workpieces and the goal is to process 2,000 workpieces per hour, then 20 workpiece carriers are needed. Transferring the workpiece carrier between a load and unload position may take, for example, 10 seconds. Eliminating this movement can increase workpiece processing by an additional 75 workpieces per hour. In addition, the use of three belts insures that there may never be a pause or gap in the flow of workpieces to the processing system. In contrast, the use of two belts necessarily creates a condition of temporary starvation as a new workpiece carrier is being loaded, unless some means of buffering is introduced.

Figure 1:
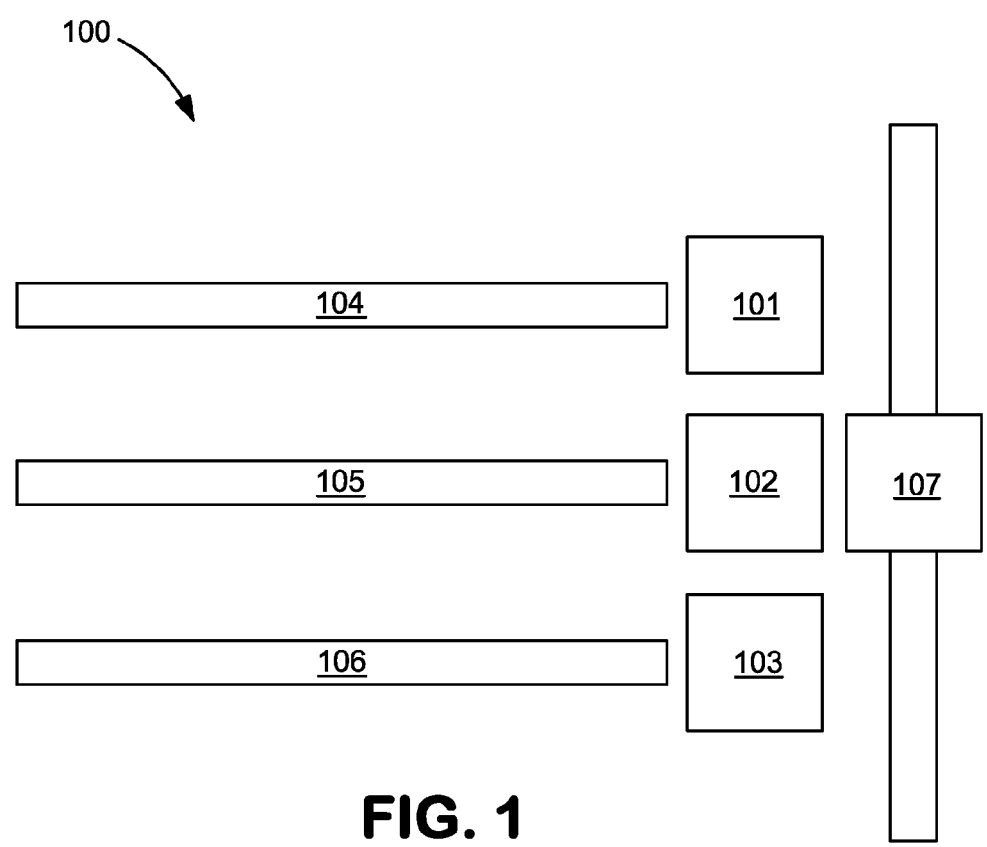
FIG. 1 is block diagram of a workpiece handling system.

FIG. 1 is block diagram of a workpiece handling system. The workpiece handling system 100 may include a stocker robot 107 used to transport workpiece carriers. A workpiece carrier may be a container having an external frame and a plurality of horizontally oriented slots inside the frame, each slot adapted to hold one workpiece. These workpiece carriers may be moved from a storage or transfer station by the stocker robot 107. The stocker robot 107 may place a workpiece carrier on an indexer 101, 102, 103 or remove the workpiece carrier from the indexer 101, 102, 103. Thus, the stocker robot 107 can exchange workpiece carriers. Additional stocker robots 107 may be used in other embodiments. These indexers 101, 102, 103 may include an elevator to enable loading or unloading of the workpieces in the workpiece carrier. Each indexer 101, 102, 103 is connected to a conveyor belt 104, 105, 106. Each conveyor belt 104, 105, 106 has a proximate end, located near the indexers, and a distal end.

The workpiece carrier may be loaded on the indexer 101, such that the bottom slot is at the same level as, or planar to, the conveyor belt 104. A load/unload mechanism may be part of the indexer 101, which is adapted to transfer the workpiece disposed in the slot that is planar to or from the proximate end of the conveyor belt 104. Once that workpiece is removed by the load/unload mechanism, the elevator moved down, or indexed downward, a distance equal to one slot. The load/unload mechanism can then remove the next workpiece. The process of removing a workpiece and indexing the elevator repeats until all workpieces have been removed from the workpiece carrier. Of course, the workpiece carrier may be loaded on the indexer 101 such that the top slot is planar with the conveyor belt 101. In this embodiment, the elevator is indexed upward after each workpiece is removed. The loading of the workpiece carrier works in a similar manner. The load/unload mechanism places a workpiece into the slot that is planar with the conveyor belt. The elevator then indexes (up or down) to the next open slot. In some embodiments, about 100 workpieces may be held in a workpiece carrier.

The conveyor belts 101, 102, 103 may be serviced by additional robots or workpiece handling devices to transport workpieces to the location where the workpieces are processed, such as to an ion implanter. In one embodiment, a gantry robot transports the workpieces to a matrix end effector. These additional robots or workpiece handling devices may be located near the distal end of the conveyor belt furthest from the indexers 101, 102, 103.

Throughout this disclosure, the removal of workpieces from the workpiece carrier and onto the conveyor belt is referred to as the "loading process", as the conveyor belt is bringing unprocessed workpieces to be processed at the distal end of the conveyor belt. Thus, unprocessed workpieces are said to be loaded into the system. The conveyor belt transporting these unprocessed workpiece may be referred to as a "loading belt". Thus, when operating as the loading belt, the direction of travel of the conveyor belt is from the proximate end toward the distal end. The process of removing processed workpieces from the conveyor belt and placing them back in the workpiece carrier is referred to as the "unloading process". The conveyor belt transporting these processed workpieces may be referred to as an "unloading belt". Thus, when operating as the unloading belt, the direction of travel of the conveyor belt is from the distal end toward the proximate end.

Thus, the workpiece handling system 100 includes three conveyor belts 104, 105, 106, each capable of operating as a loading or unloading belt. The workpiece handling system also includes three indexers 101, 102, 103, each associated with a respective conveyor belt. These indexers are used to provide unprocessed workpieces to the loading belt and serve as a repository for processed workpieces on the unloading belt. In some embodiments, the workpiece handling system 100 may interact with a dedicated stocker robot 107. However, as explained below, in some embodiments, a single stocker robot can be used with multiple workpiece handling systems.

As described above, many systems include a set of two conveyor belts, a first conveyor belt dedicated to the loading process (i.e. a loading belt) and a second conveyor belt dedicated to the unloading process (i.e. an unloading belt).

The use of three conveyor belts 104, 105, 106 has multiple advantages. First, one of the conveyor belts 104, 105, 106 is always available to be used to queue new unprocessed workpieces while two of the other conveyor belts 104, 105, 106 may act as loading and unloading belts. For example, a workpiece carrier can be exchanged on one indexer 101 while the other two indexers 102, 103 are being used to load and unload two other workpiece carriers. Thus, the use of three conveyor belts 104, 105, 106 may prevent interruption of the flow of workpieces caused by the introduction of a new workpiece carrier. Additionally, use of three conveyor belts 104, 105, 106 does not greatly impact the overall cost or footprint of the workpiece handling system 100. Further, as explained below, the use of exactly three belts maximizes the throughput, such that the introduction of a fourth belt would not further increase throughput.

FIGS. 2-15 represent an embodiment using either one or two workpiece handling systems. While a specific embodiment is illustrated in FIGS. 2-15, other variations of this method are possible using one or two workpiece handling systems. These workpiece handling systems may be serviced by one stocker robot, one stocker robot per workpiece handling system, or other numbers of robots. In one particular embodiment, these workpiece handling systems may feed into the same load lock or into different load locks of the ion implanter.

Figure 2:
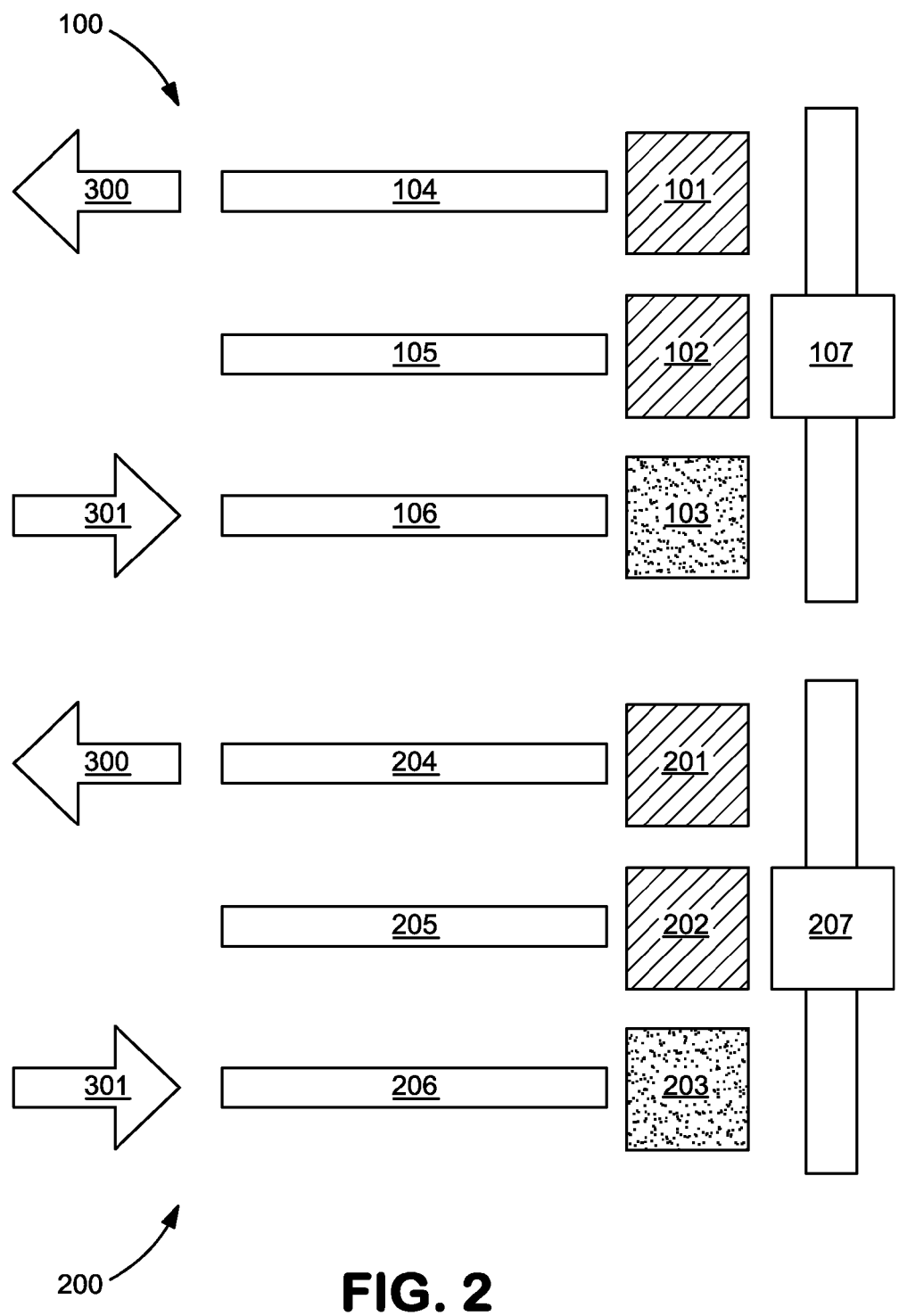
FIGS. 2-15 represent an embodiment of using two workpiece handling systems.

FIG. 2 illustrates use of a first workpiece handling system 100 and a second workpiece handling system 200. The first workpiece handling system 100 includes indexers 101, 102, 103, conveyor belts 104, 105, 106 and stocker robot 107. The second workpiece handling system 200 includes indexers 201, 202, 203, conveyor belts 204, 205, 206 and stocker robot 207. As will be described later, in some embodiments one stocker robot can be shared by the first and second workpiece handling systems 100, 200.

A controller (not shown) may be in communication with the indexers 101, 102, 103, so as to be able to control their movements. The controller may also be in communication with the conveyor belts 104, 105, 106, so as to change the direction of travel of each belt. The controller may also be in communication with the stocker robot 107, so as to control its operation in exchanging workpiece carriers for the indexers. The controller may also have a storage element electrically coupled thereto. The storage element may contain instructions and other information. The instructions may enable the controller to perform all of the steps, processes and methods described herein.

To begin this process, as shown in FIG. 2, the indexers 101, 102, 201, and 202 contain workpiece carriers filled with unprocessed workpieces (as represented by the hash marks). The indexers 103, 203 contain empty workpiece carriers (as represented by the dots). The conveyor belts 104, 204 are loading (as represented by the arrows 300) workpieces for processing, such as within an ion implanter. The conveyor belts 106, 206 are unloading (as represented by the arrows 301) workpieces back into the workpiece carriers on the indexers 103, 203. Thus, workpieces are being removed from the workpiece carrier disposed on indexer 101 and placed on conveyor belt 104. They are transported in the direction indicated by arrow 300 to a processing station (not shown). After processing, the workpieces are placed on the conveyor belt 106 by a workpiece handler (not shown) where they are moved in the direction indicated by arrow 301 back toward indexer 103. They are then loaded into the workpiece carrier disposed on the indexer 103. This process continues while the workpiece carrier disposed on indexer 101 has workpieces. Thus, conveyor belt 104 is the loading belt and conveyor belt 106 is the unloading belt during this step in the sequence.

To better explain the operation of the workpiece handling system, only the operation of first workpiece handling system 100 illustrated in FIGS. 2-15 will be described. The operation of the second workpiece handling system 200 and the interaction between the first and second workpiece handling systems 100, 200 will be described later.

Figure 3:
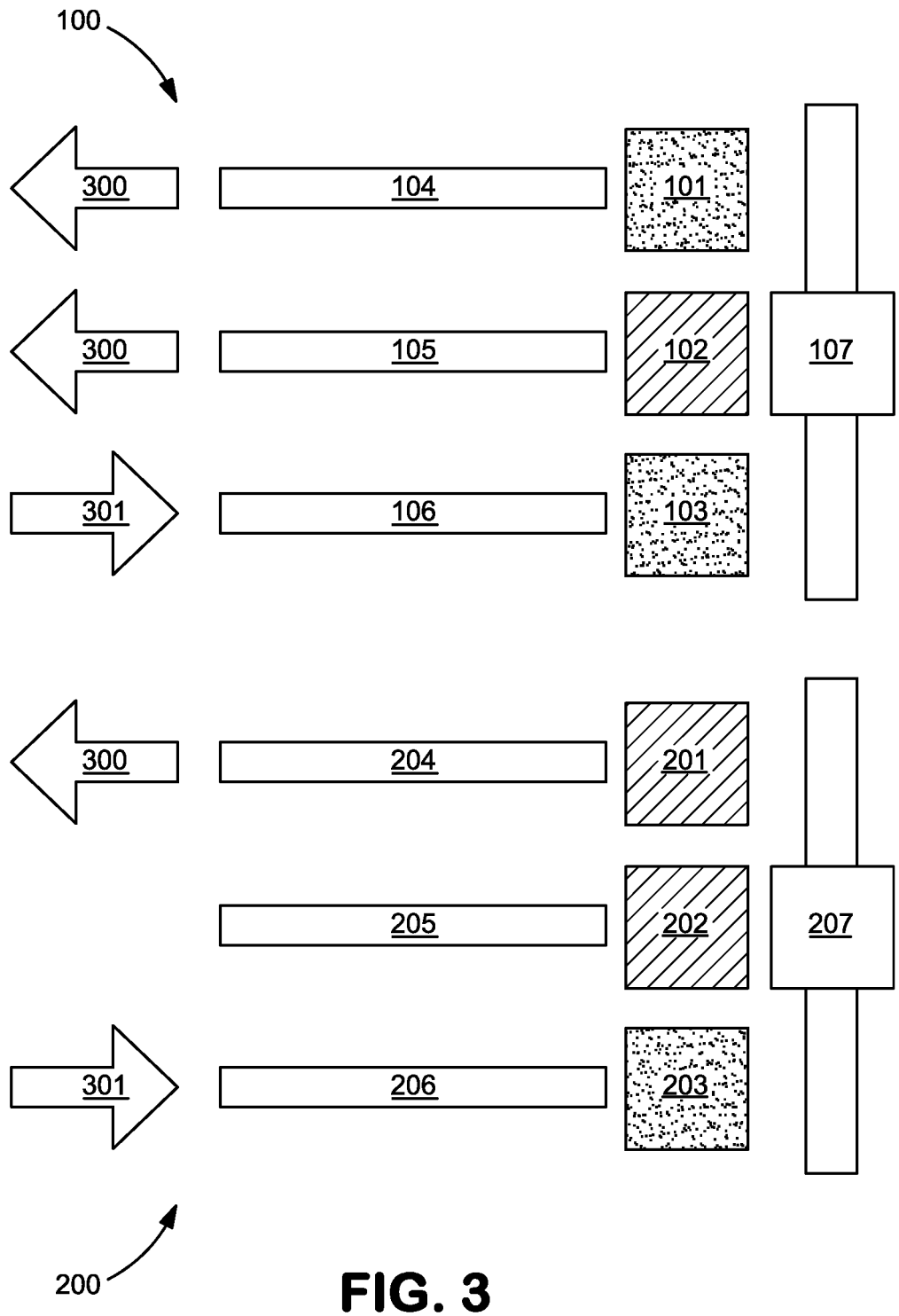

In FIG. 3, the workpiece carrier on the indexer 101 has emptied (as represented by dots) and the conveyor belt 105 begins loading workpieces (as represented by the arrow 300). In some embodiments, the conveyor belt 105 may begin loading prior to the emptying of the workpiece carrier on the indexer 101. Specifically, the workpiece carrier on the indexer 101 is now available to unload processed workpieces. In addition, conveyor belt 106 is still acting as an unloading belt until all of the workpieces from conveyor belt 104 have been processed and returned on conveyor belt 106. Conveyor belt 105 now begins operating as a loading belt, such that unprocessed workpieces are available at the distal end immediately after the last workpiece from conveyor belt 104 has been removed.

Figure 4:
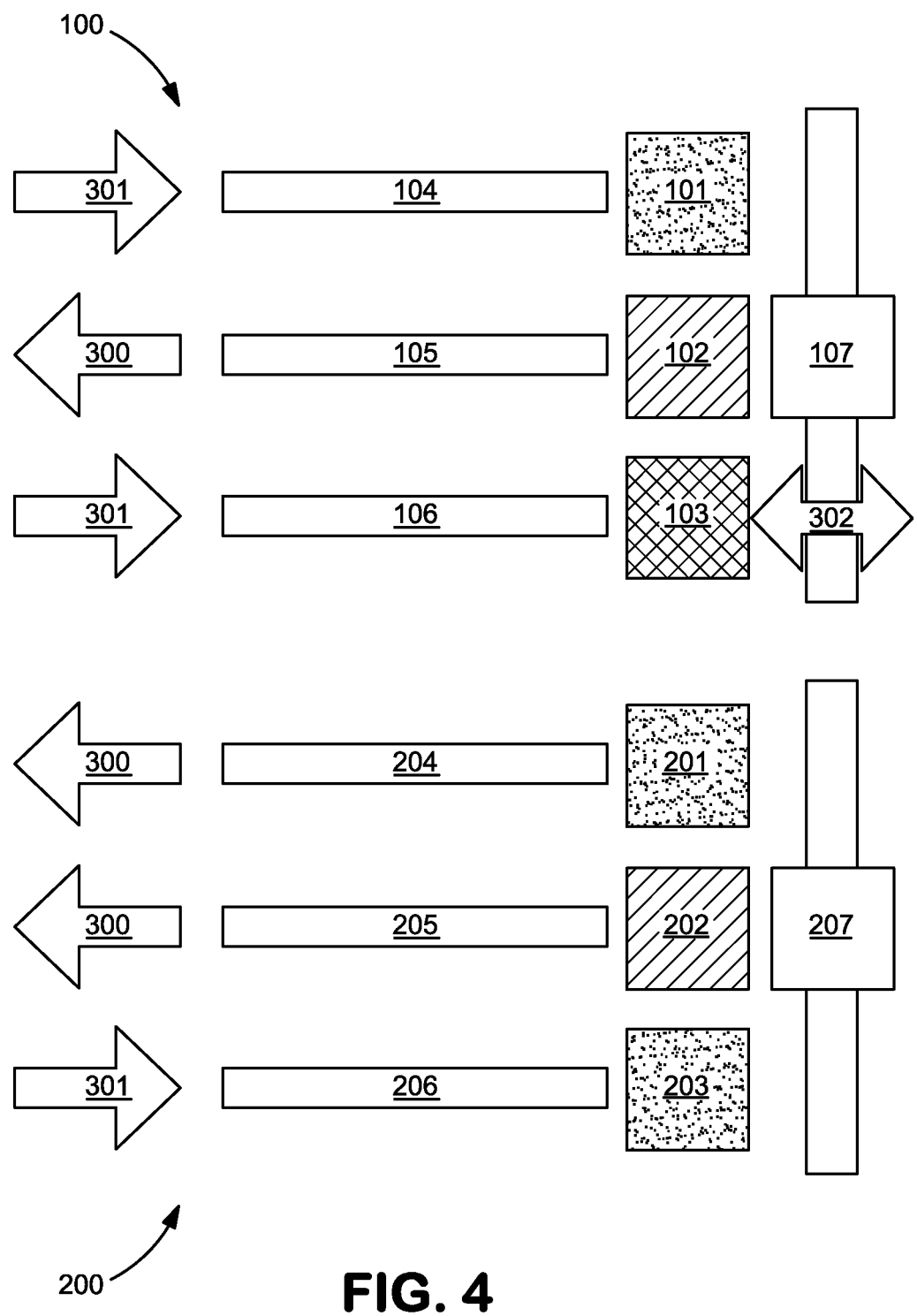

In FIG. 4, the workpiece carrier on indexer 103 is filled with processed workpieces (as represented by the crosshatch markings) and may be exchanged for one filled with unprocessed workpieces (as represented by the arrow 302). The conveyor belt 104 begins unloading workpieces (as represented by the arrow 301). Thus, during this step of the process, conveyor belt 105 is the loading belt and conveyor belt 104 is the unloading belt. Conveyor belt 106 is idle during this time so that a new workpiece carrier can be installed.

Figure 5:
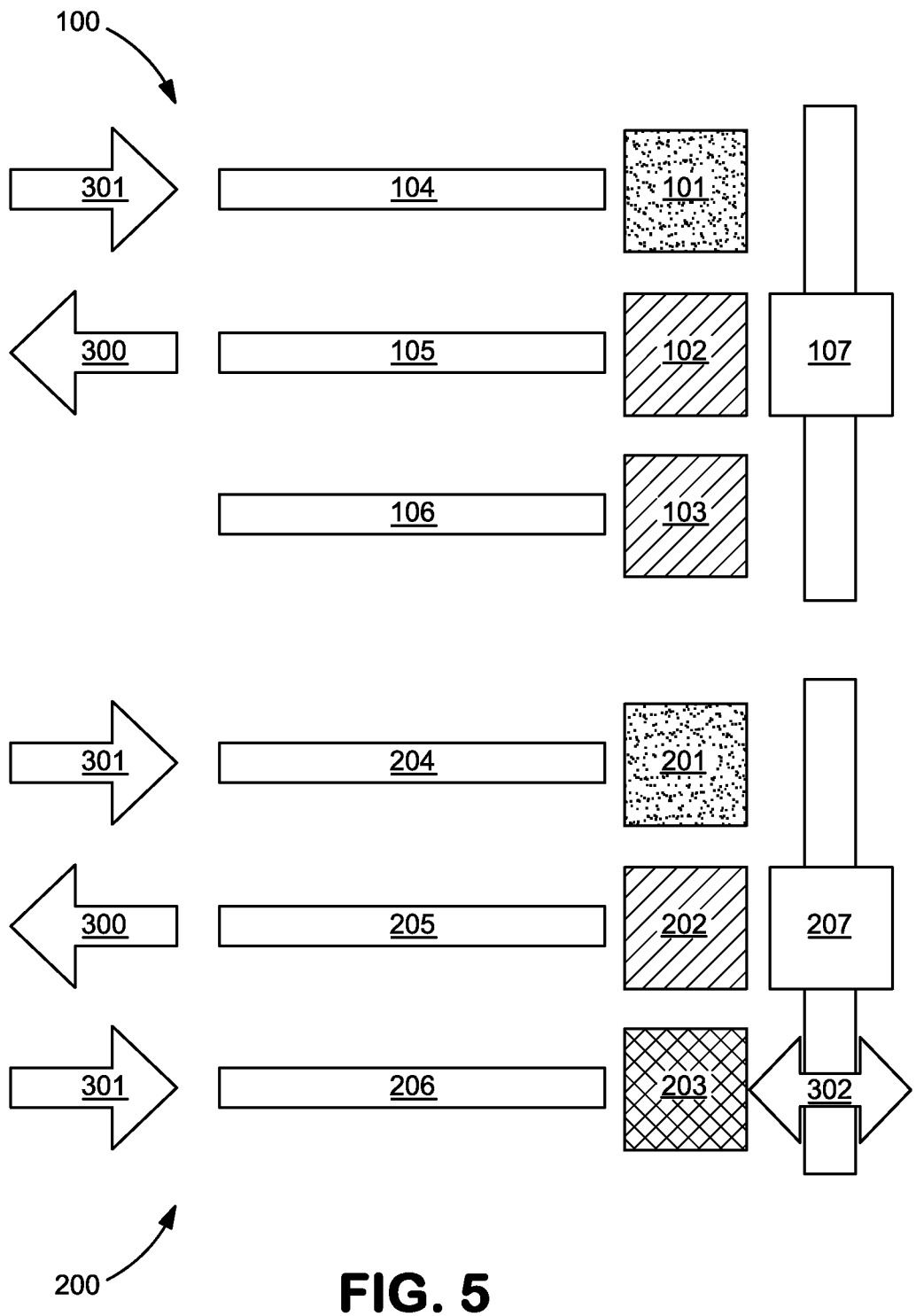

In FIG. 5, the workpiece carrier on indexer 103 has been replaced with a new one, filled with unprocessed workpieces (as represented by the hash marks). Conveyor belt 106 is not loading or unloading workpieces into the workpiece carrier on the indexer 103 at this time. As in the previous figure, conveyor belt 104 is serving as the unloading belt and conveyor belt 105 is acting as the loading belt.

Figure 6:
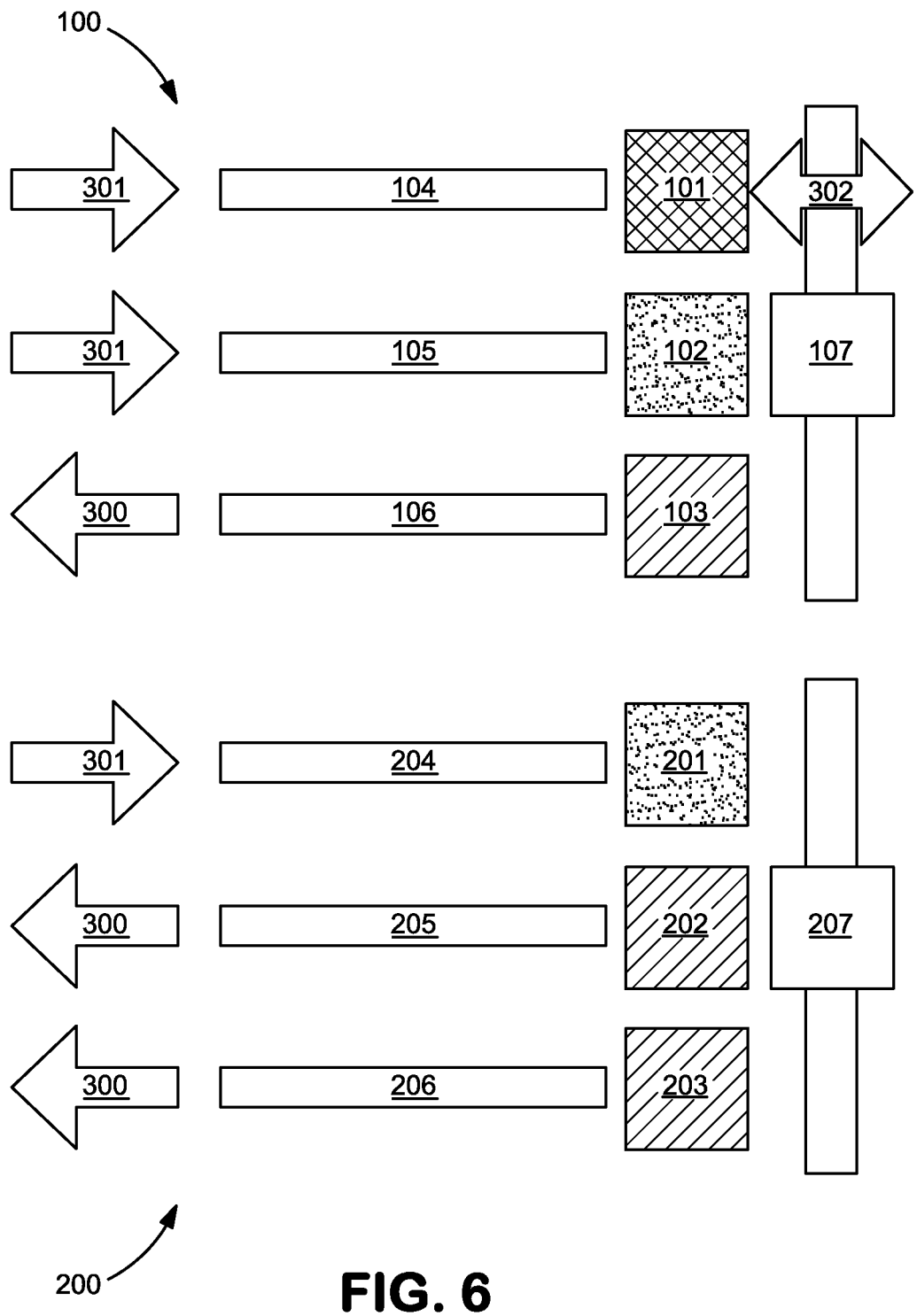

In FIG. 6, the workpiece carrier on indexer 101 is filled (as represented by the crosshatch markings) and may be exchanged for one filled with unprocessed workpieces (as represented by the arrow 302). The workpiece carrier on the indexer 102 has emptied (as represented by the dots) and the conveyor belt 105 begins unloading workpieces (as represented by the arrow 301). The conveyor belt 106 begins loading workpieces (as represented by the arrow 300). Thus, conveyor belt 106 is the loading belt, while conveyor belt 105 is the unloading belt.

Figure 7:
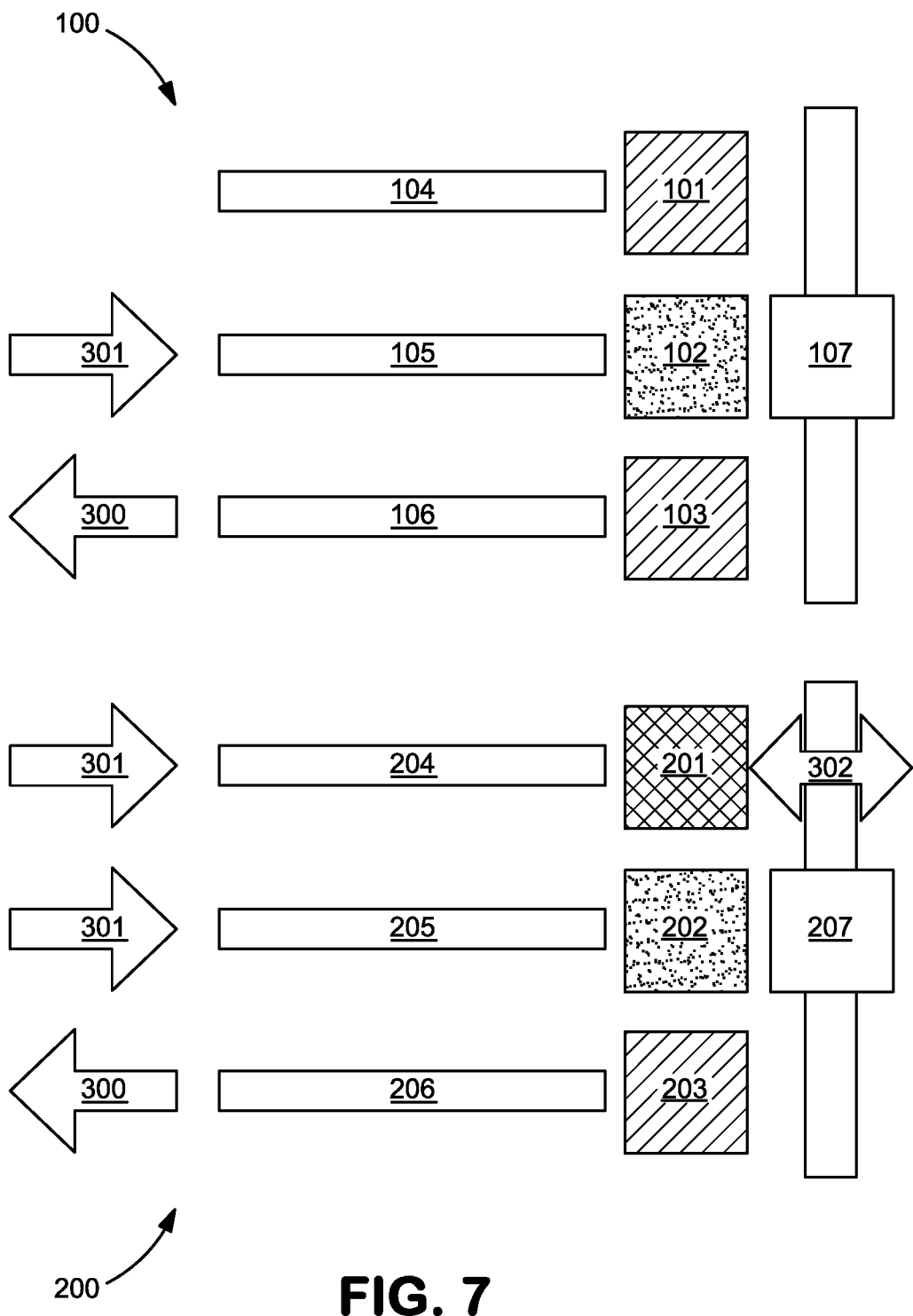

In FIG. 7, the workpiece carrier on indexer 101 has been exchanged and is now full of unprocessed workpieces (as represented by hash marks). The conveyor belt 104 is not loading or unloading workpieces into the workpiece carrier on the indexer 101 at this time. Rather, conveyor belt 106 continues operating as the loading belt, while conveyor belt 105 continues operating as the unloading belt.

Figure 8:
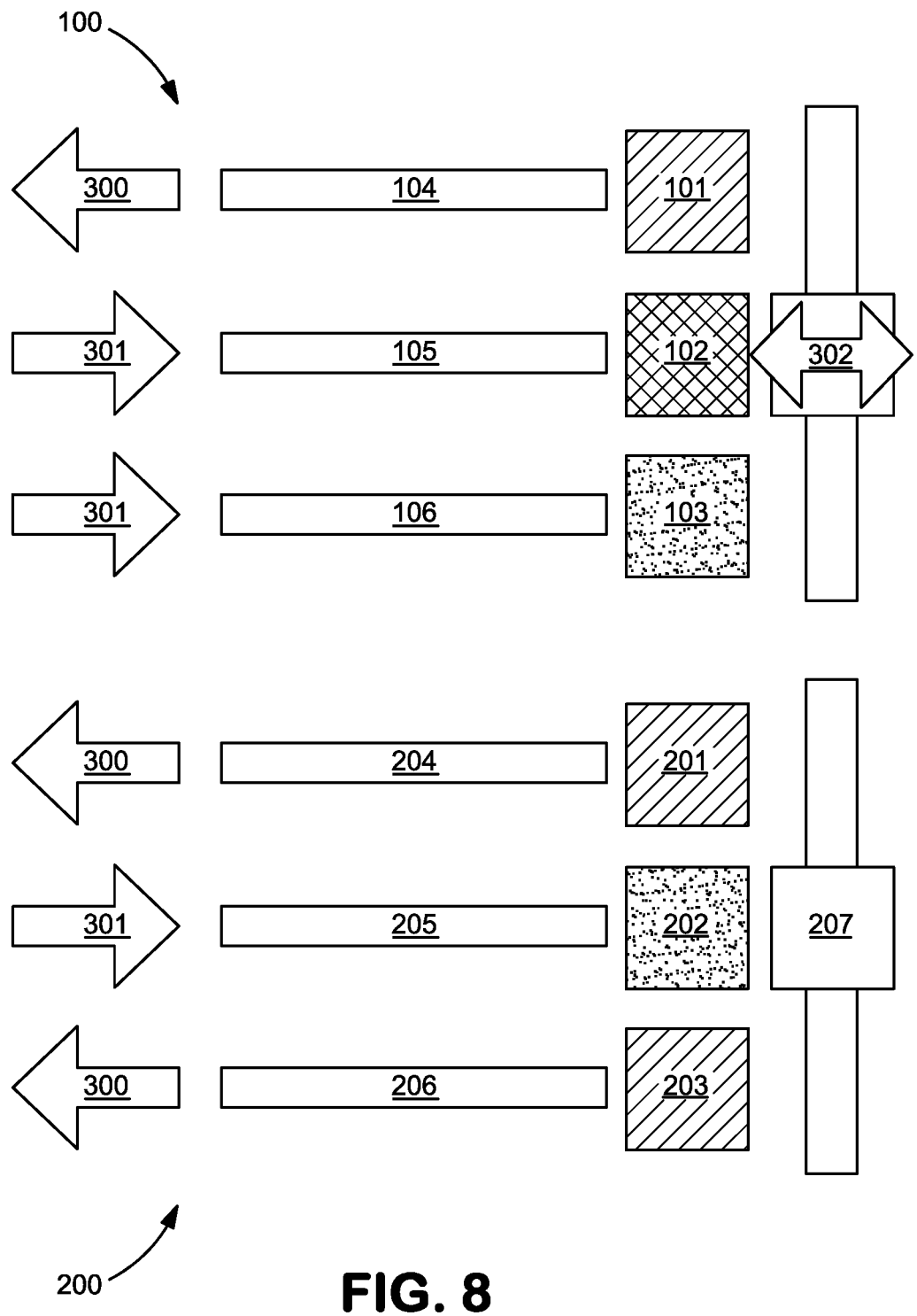

In FIG. 8, the workpiece carrier on indexer 102 is filled with processed workpieces (as represented by crosshatch markings) and may be exchanged for one filled with unprocessed workpieces (as represented by the arrow 302). The workpiece carrier on the indexer 103 has emptied (as represented by the dots). The conveyor belt 104 begins loading workpieces (as represented by the arrow 300). Since the workpiece carrier on the indexer 103 is empty, conveyor belt 106 serves as the unloading belt (as represented by the arrow 301).

Figure 9:
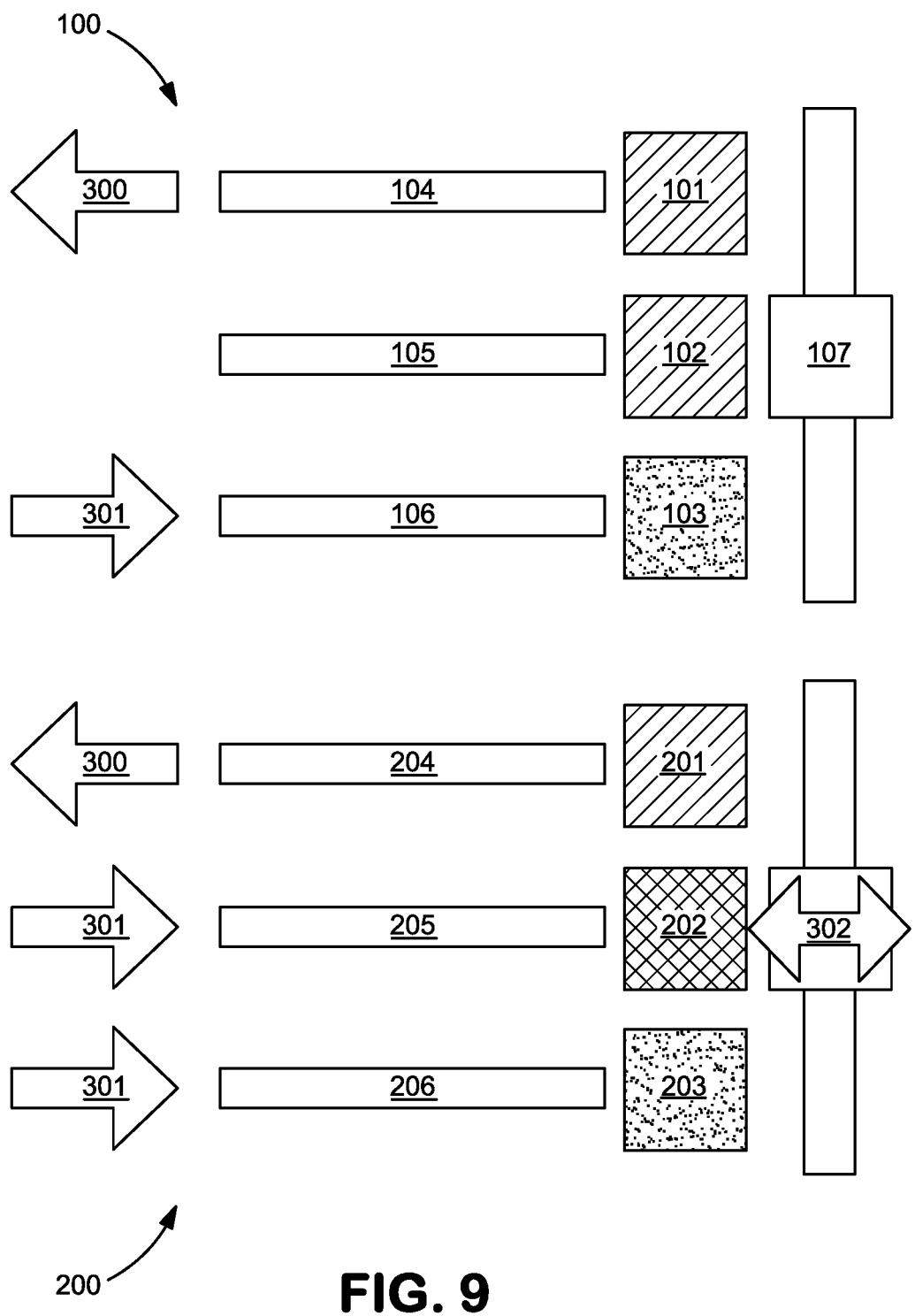

In FIG. 9, the workpiece carrier on indexer 102 has been replaced with one filled with unprocessed workpieces (as represented by the hash marks). Conveyor belt 105 is idle during this time. Conveyor belt 104 serves as the loading belt while conveyor belt 106 serves as the unloading belt by this step of the sequence. The first workpiece handling system 100 is now back to the configuration shown in FIG. 2, having completed a cycle.

The sequence shown in FIGS. 2-8 represent one complete cycle of the first workpiece handling system 100. FIG. 16 shows a table showing each step in this sequence. Note that during a complete cycle, each of conveyor belts 104, 105, 106 has operated as the loading belt and the unloading belt one time. In other words, each conveyor belt has traveled in each direction (arrow 300 and 301) during this cycle. In addition, the workpiece carrier associated with each conveyor belt has been exchanged one time as well. For example, in FIG. 16, workpiece carriers are exchanged during steps 3, 6 and 9. Specifically, an exchange occurs after a workpiece carrier has been completely filled. If 2000 workpieces are to be processed in one hour, a workpiece carrier holding 100 workpieces is filled in about 3 minutes. Due to the time between these steps, it is possible to use one stocker robot 107 to service all three conveyor belts 104, 105, 106. FIG. 16 shows the function of each belt at a particular time. In addition, the numbers included in the graph represent which set of workpieces (i.e. first set, second set) is involved in that step.

In step 1, a first workpiece carrier filled with a first set of unprocessed workpieces is placed on the first indexer 101. A second workpiece carrier filled with a second set of unprocessed workpiece is also placed on the second indexer 102. An empty workpiece carrier is placed on the third indexer 103. The first set of workpieces are removed from the first workpiece carrier on the first indexer 101 and placed on the first conveyor belt 104. These are removed at the distal end of the conveyor belt 104 by the processing system. After being processing, the processing system returns this first set of workpieces to the distal end of the third conveyor belt 106. The first set of workpieces then travel back to the third indexer 103, where the third workpiece carrier is filled. Thus, the first conveyor belt 104 is the loading belt for the first set of workpieces while the third conveyor belt 106 is the unloading belt.

In step 2, the first conveyor belt 104 changes direction as soon as the last workpiece is removed from the first conveyor belt 104 by the processing system. In addition, the third workpiece carrier is now filled with the first set of processed workpieces. The second indexer 102 starts removing a second set of workpieces from the second workpiece carrier and placing them on the second conveyor belt 105. Thus, the second conveyor belt 105 is the loading belt for the second set of workpieces, while the first conveyor belt 104 is the unloading belt.

In step 3, the third workpiece carrier disposed on the third indexer 103 is exchanged for a fourth workpiece carrier, which is filled with a third set of unprocessed workpieces, as shown in step 4. The second conveyor belt 105 is still the loading belt for the second set of workpieces, while the first conveyor belt 104 is still the unloading belt during these steps.

In step 5, the second conveyor belt 105 changes direction as soon as the last workpiece is removed from the second conveyor belt 105 by the processing system. In addition, the first workpiece carrier is now filled with the second set of processed workpieces. The third indexer 103 starts removing a third set of workpieces from the fourth workpiece carrier and placing them on the third conveyor belt 106. Thus, the third conveyor belt 106 is the loading belt for the third set of workpieces, while the second conveyor belt 105 is the unloading belt.

In step 6, the first workpiece carrier disposed on the first indexer 101 is exchanged for a fifth workpiece carrier, which is filled with a fourth set of unprocessed workpieces, as shown in step 7. The third conveyor belt 106 is still the loading belt for the third set of workpieces, while the second conveyor belt 105 is still the unloading belt during these steps.

In step 8, the third conveyor belt 106 changes direction as soon as the last workpiece is removed from the third conveyor belt 106 by the processing system. In addition, the second workpiece carrier is now filled with the third set of processed workpieces. The first indexer 101 starts removing a fourth set of workpieces from the fifth workpiece carrier and placing them on the first conveyor belt 104. Thus, the first conveyor belt 104 is the loading belt for the fourth set of workpieces, while the third conveyor belt 106 is the unloading belt.

In step 9, the second workpiece carrier disposed on the second indexer 102 is exchanged for a sixth workpiece carrier, which is filled with a fifth set of unprocessed workpieces, as shown in step 10. The first conveyor belt 104 is still the loading belt for the fourth set of workpieces, while the third conveyor belt 106 is still the unloading belt during these steps.

At step 10, the workpiece handling system 100 is in the same state as it was in step 1, and the cycle then repeats.

Further, in some embodiments, a conveyor belt may serve as the unloading belt immediately after serving as the loading belt. In other words, once all of the unprocessed workpieces have been emptied from a particular workpiece carrier, that workpiece carrier is used to start storing the processed workpieces.

In some embodiments, all of the workpieces removed from one workpiece carrier, such as the carrier on indexer 101, may be processed and then all saved in a second workpiece carrier, such as the one on indexer 103. In other words, one conveyor belt serves as the unloading belt for another conveyor belt. Of course, in other embodiments, workpieces from a single workpiece carrier may be processed and saved in more than one other workpiece carriers.

In some embodiments, a second conveyor belt may begin emptying unprocessed workpieces from its workpiece carrier immediately after the last workpiece has been emptied from another carrier. This minimizes the delay in processing time.

In FIGS. 10-15, the first workpiece handling system 100 repeats the steps shown in the previous figures. For example, in FIG. 10, which is the same as FIG. 4, the workpiece carrier on indexer 103 is filled with processed workpieces (as represented by the crosshatch markings) and may be exchanged for one filled with unprocessed workpieces (as represented by the arrow 302). The conveyor belt 105 begins loading workpieces (as represented by the arrow 300). The workpiece carrier on the indexer 101 has emptied (as represented by the dots) and the conveyor belt 104 begins unloading workpieces (as represented by the arrow 301). Thus, during this step of the process, conveyor belt 105 is the loading belt and conveyor belt 104 is the unloading belt. Conveyor belt 106 is idle during this time so that a new workpiece carrier can be installed.

Figure 11:
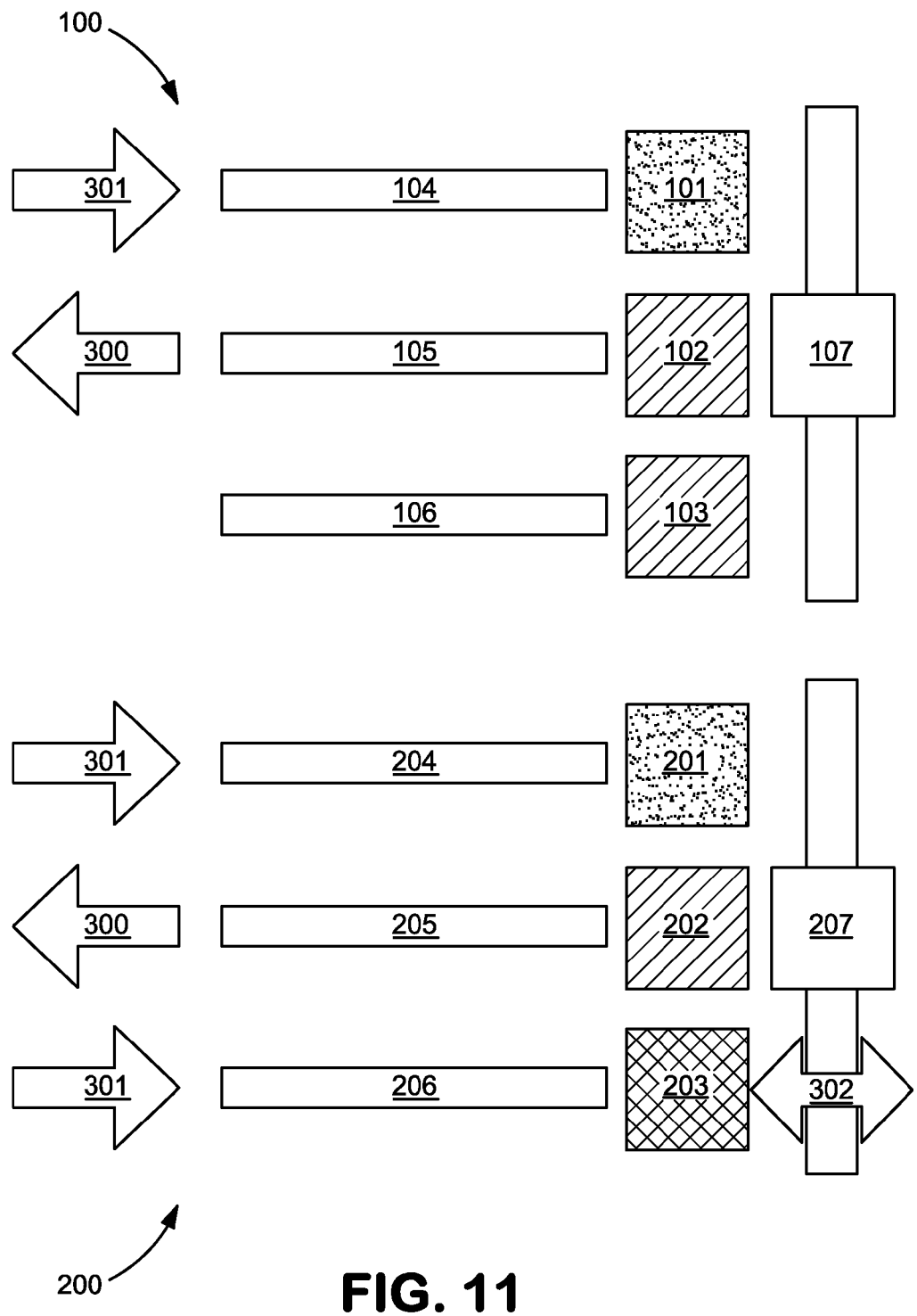

In FIG. 11, like FIG. 5, the workpiece carrier on indexer 103 has been replaced with a new one, filled with unprocessed workpieces (as represented by the hash marks). Conveyor belt 106 is not loading or unloading workpieces into the workpiece carrier on the indexer 103 at this time. As in the previous figure, conveyor belt 104 is serving as the unloading belt and conveyor belt 105 is acting as the loading belt.

Figure 12:
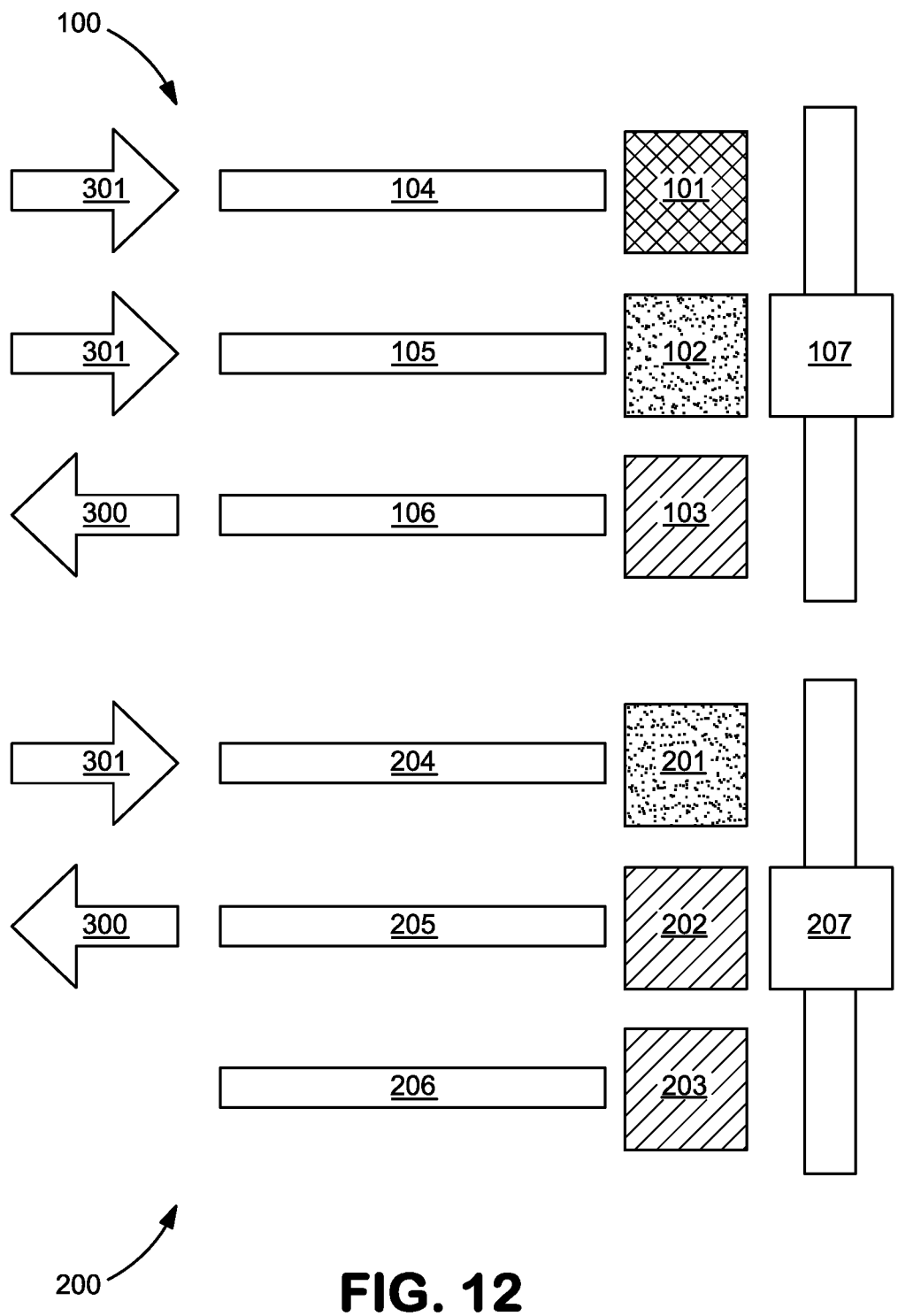

In FIG. 12, like FIG. 6, the workpiece carrier on the indexer 102 has emptied (as represented by the dots) and the conveyor belt 105 begins unloading workpieces (as represented by the arrow 301). The conveyor belt 106 begins loading workpieces (as represented by the arrow 300). The workpiece carrier on the indexer 101 may be full of processed workpieces (as represented by the crosshatch markings). The storage or transfer station served by the stocker robots 107, 207 may be refilled with workpiece carriers of unprocessed workpieces at this time in one instance.

Figure 13:
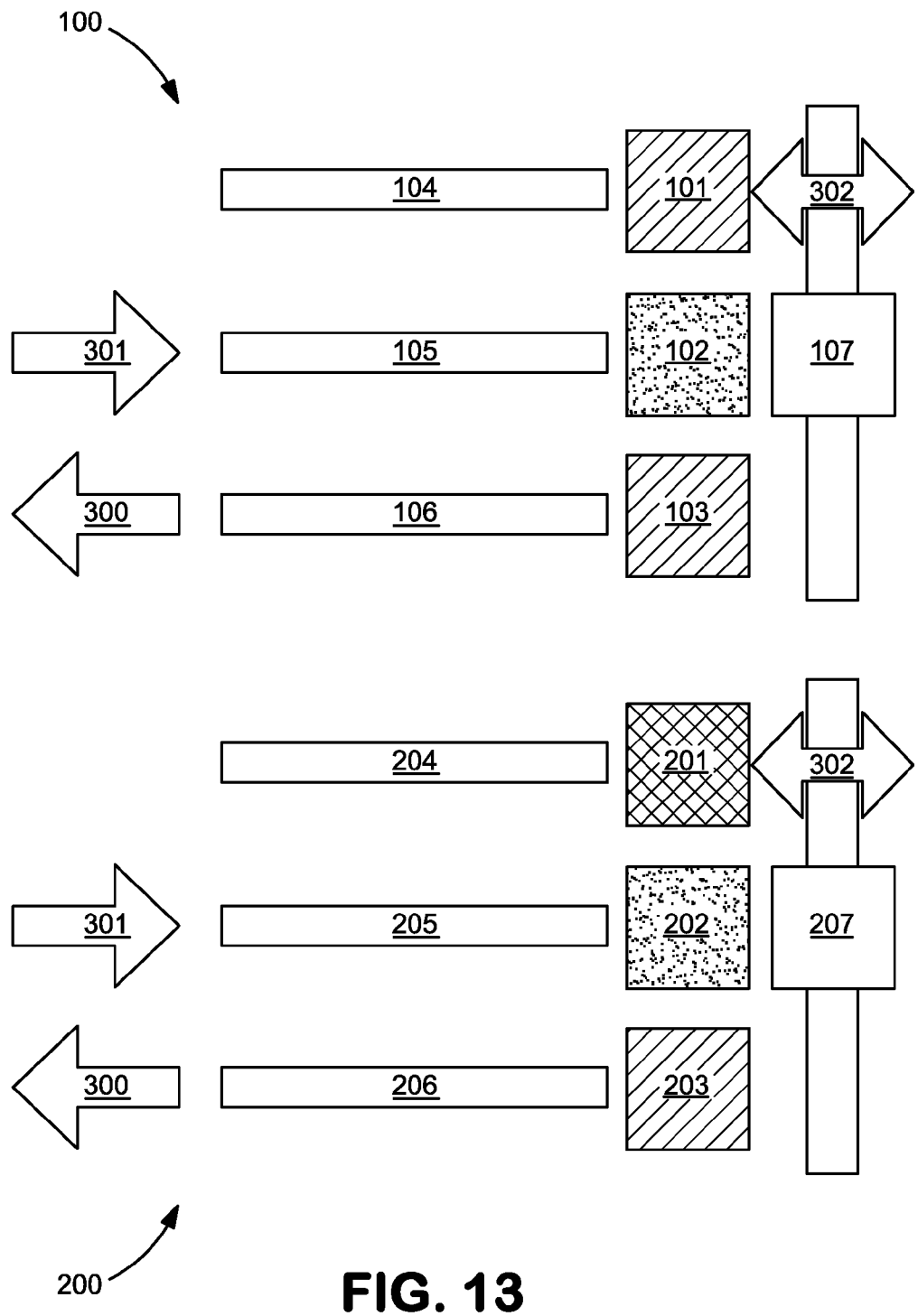

FIG. 13 shows the exchange of workpiece carriers for indexer 101 (as represented by arrow 302).

Figure 14:
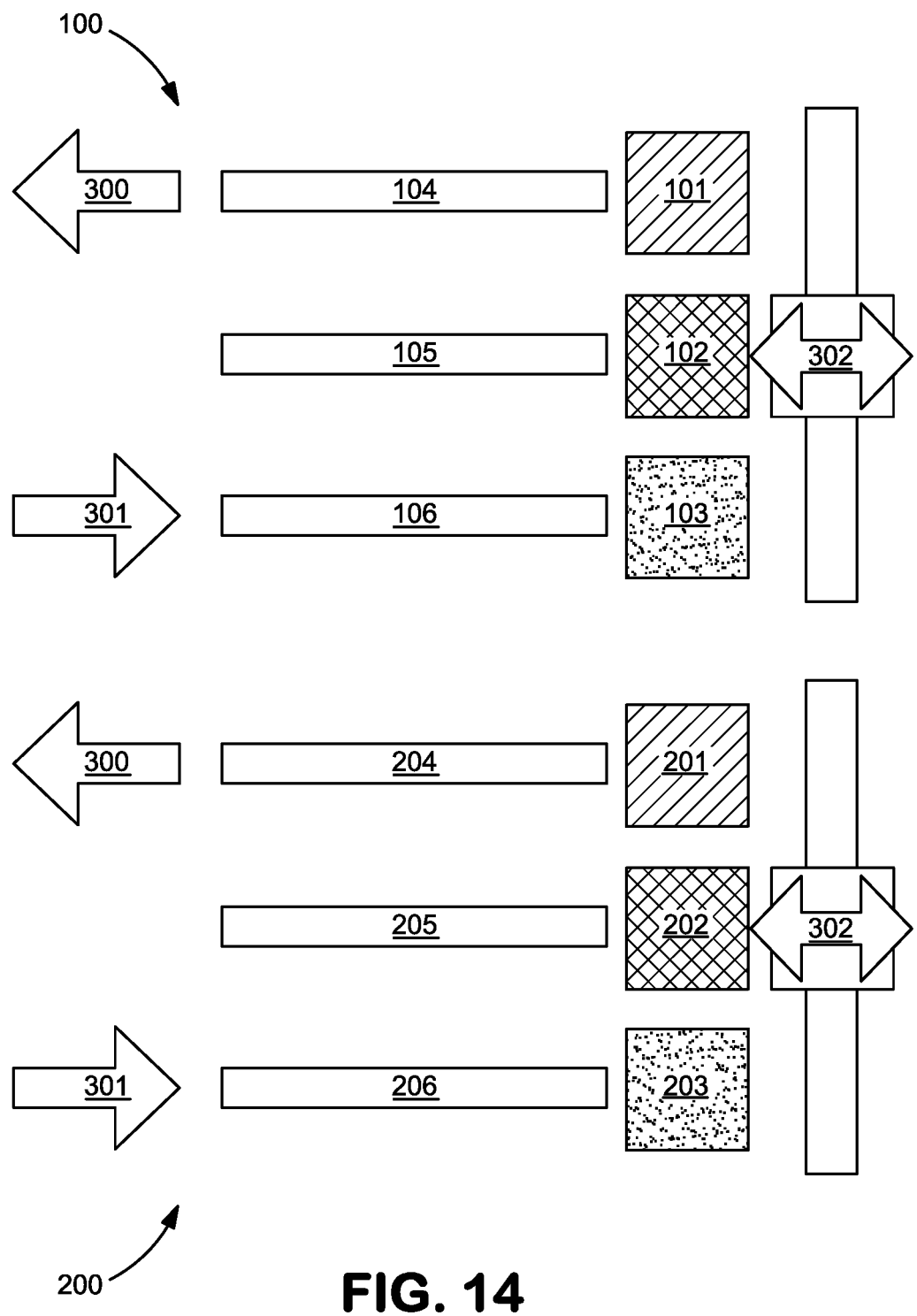

In FIG. 14, like FIG. 8, the workpiece carrier on indexer 102 is filled with processed workpieces (as represented by crosshatch markings) and may be exchanged for one filled with unprocessed workpieces (as represented by the arrow 302). The workpiece carrier on the indexer 103 has emptied (as represented by the dots) and the conveyor belt 106 begins unloading workpieces (as represented by the arrow 301). The conveyor belt 104 begins loading workpieces (as represented by the arrow 300).

Figure 10:
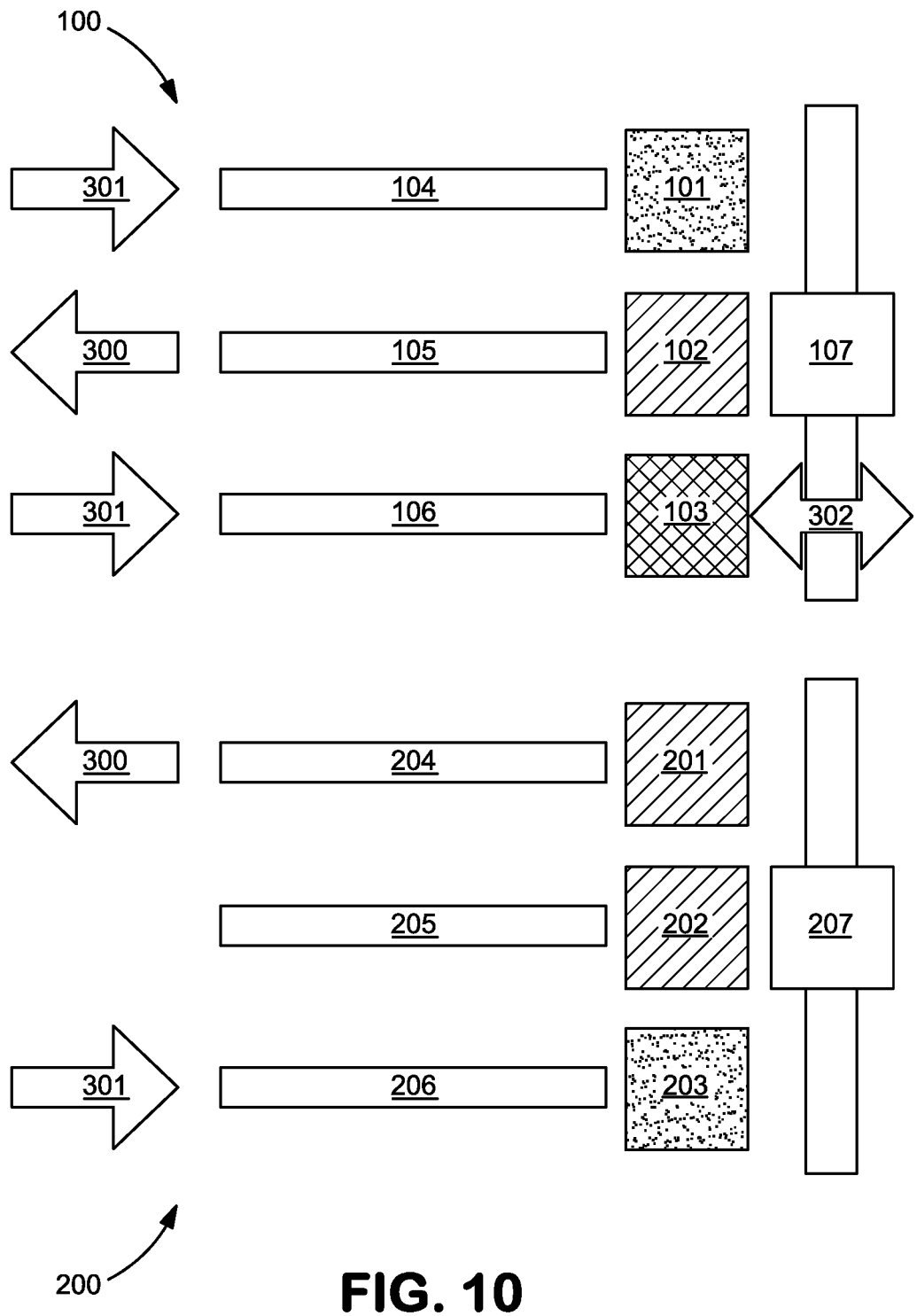
Figure 15:
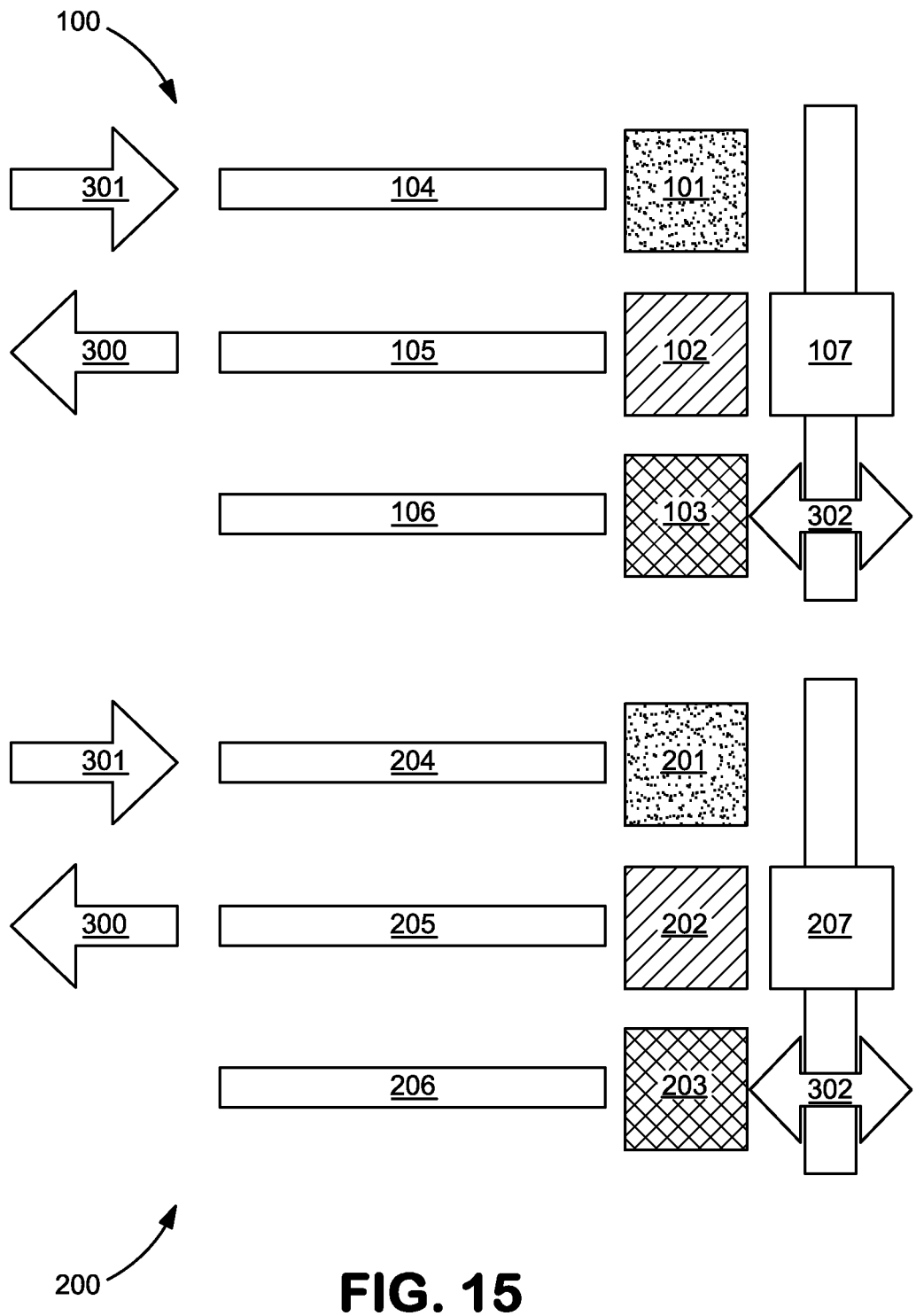

In FIG. 15, like FIG. 10, the workpiece carrier on indexer 103 is filled with processed workpieces (as represented by the crosshatch markings) and may be exchanged for ones filled with unprocessed workpieces (as represented by the arrow 302). The workpiece carrier on the indexer 101 has emptied (as represented by the dots) and the conveyor belt 104 begins unloading workpieces (as represented by the arrow 301). The conveyor belt 105 begins loading workpieces (as represented by the arrow 300).

As explained above, the process illustrated in FIGS. 2-15 may occur only using the workpiece handling system 100. Thus, the process may occur only using the conveyor belts 104, 105, 106. This process may loop back to the step illustrated in FIG. 4 or FIG. 12 from FIG. 15 or may continuously loop as illustrated in FIGS. 4-10. It may also repeat the steps shown in FIGS. 2-9, as explained above. In some embodiments, it repeats the sequence shown in FIG. 16.

Having explained the operation of a single workpiece handling system 100, the figures will now be described again, showing the operation of a second workpiece handling system 200 operating in parallel.

FIG. 2 shows the second workpiece handling system 200 configured like the first workpiece handling system 100. Specifically, conveyor belt 204 is the loading belt and conveyor 206 is the unloading belt. The workpiece carriers on indexers 201, 202 are both filled with unprocessed workpieces (as represented by the hash markings). The workpiece carrier on indexer 203 is empty (as represented by dots).

In some embodiments, the operation of the two workpiece handling systems 100, 200 is staggered. For example, FIG. 3 shows the first workpiece handling system 100 beginning operation while the second workpiece system 200 remains idle.

FIG. 4 shows the conveyor belt 204 serving as the loading belt, while conveyor belt 206 is the unloading belt. The workpiece carrier on indexer 202 is still filled with unprocessed workpieces. The workpiece carrier on the indexer 201 has emptied (as represented by the dots).

In FIG. 5, the workpiece carrier on indexer 203 is filled with processed workpieces (as represented by the crosshatch markings) and may be exchanged for one filled with unprocessed workpieces (as represented by the arrow 302). The conveyor belt 204 begins unloading workpieces (as represented by the arrow 301), while conveyor 205 serves as the loading belt.

In FIG. 6, the conveyor belt 206 begins loading workpieces (as represented by the arrow 300) after conveyor belt 205 has loaded its final workpiece. Conveyor belt 204 is the unloading belt for conveyor belt 205. As soon as the last workpiece is removed from conveyor belt 205, it will become the unloading belt for conveyor belt 206.

In FIG. 7, the workpiece carrier on indexer 201 is filled with processed workpieces (as represented by the crosshatch markings) and may be exchanged for one filled with unprocessed workpieces (as represented by the arrow 302). The workpiece carrier on the indexer 202 has emptied (as represented by the dots) and the conveyor belt 205 begins unloading workpieces (as represented by the arrow 301). Conveyor belt 206 is the loading belt.

In FIG. 8, the conveyor belt 205 continues unloading workpieces (as represented by the arrow 301). The conveyor belt 204 is ready to start loading workpieces (as represented by the arrow 300) as soon as the last workpiece is loaded by conveyor belt 206.

In FIG. 9, the workpiece carrier on indexer 202 is filled with processed workpieces and may be exchanged for one filled with unprocessed workpieces (as represented by the arrow 302). The workpiece carrier on the indexer 203 has emptied and the conveyor belt 206 begins unloading workpieces (as represented by the arrow 301). Conveyor belt 204 is the loading belt.

In FIG. 10, the conveyor belt 205 is ready to begin loading workpieces (as represented by the arrow 300) as soon as the last workpiece is loaded in conveyor belt 204. Conveyor belt 206 is the unloading belt for conveyor belt 204.

In FIG. 11, the workpiece carrier on indexer 203 is filled and may be exchanged for one filled with unprocessed workpieces (as represented by the arrow 302). The workpiece carrier on the indexer 201 has emptied and the conveyor belt 204 begins unloading workpieces (as represented by the arrow 301). Conveyor belt 205 is the loading belt.

In FIG. 12, the conveyor belts 206 begin loading workpieces (as represented by the arrow 300) as soon as the final workpiece is loaded on conveyor belt 205. The workpiece carrier on the indexer 202 may be emptied by the end of this step. The storage or transfer station served by the stocker robots 107, 207 may be refilled with workpiece carriers of unprocessed workpieces at this time in one instance.

In FIG. 13, the workpiece carrier on indexer 201 is filled and may be exchanged for one filled with unprocessed workpieces (as represented by the arrow 302). The workpiece carrier on the indexer 202 has emptied and the conveyor belt 205 begins unloading workpieces (as represented by the arrow 301).

In FIG. 14, the workpiece carrier on indexer 202 is filled and may be exchanged for one filled with unprocessed workpieces (as represented by the arrow 302). The workpiece carrier on the indexer 203 has emptied and the conveyor belt 206 begins unloading workpieces (as represented by the arrow 301). The conveyor belt 204 begins loading workpieces (as represented by the arrow 300).

In FIG. 15, the workpiece carrier on indexer 203 is filled and may be exchanged for one filled with unprocessed workpieces (as represented by the arrow 302). The workpiece carrier on the indexer 201 has emptied and the conveyor belt 204 begins unloading workpieces (as represented by the arrow 301). The conveyor belt 205 begins loading workpieces (as represented by the arrow 300).

The process may then loop back to the step illustrated in FIG. 4 or FIG. 12 from FIG. 15. In another embodiment, the process illustrated in FIGS. 4-10 may continuously loop, avoiding the steps illustrated in FIGS. 11-15. To simplifying the drawings, FIGS. 13-15 may have condensed various steps. These various steps illustrated in FIGS. 13-15 may occur sequentially rather than simultaneously.

Note that in FIGS. 3-10, the process being performed by the second workpiece handling system 200 lags that being performed by the first workpiece handling system. Specifically, the second workpiece handling system 200 is performing the operation that was performed by the first workpiece handling system in the previous figures. For example, the second handling system 200 performs an operation in FIG. 5 that was performed by the first workpiece handling system 100 in FIG. 4. In this way, the two systems may be operated slightly out of phase with respect to one another. One advantage of operating the two workpiece handling systems 100, 200 is this manner may be reduced components. For example, note that between FIG. 4 and FIG. 10, one and exactly one workpiece carrier is being exchanged in each figure. Thus, in some embodiments, a single stocker robot 107 may be used with both workpiece handling systems 100, 200.

For example, each workpiece handling system may execute the sequence shown in FIG. 16. However, the first workpiece handling system 100 may be started first. When the first workpiece handling system 100 has unloaded half of the workpieces from the first workpiece carrier, the sequence is started on the second workpiece handling system. In this way, the stocker robot 107 has the maximum amount of time to exchange each workpiece carrier as it is filled by the respective workpiece handling system 100, 200. In some embodiments, three or more workpiece handling systems may be used with a single stocker robot 107. In the case of N workpiece handling systems, the second workpiece handling system begins operation after the first workpiece handling system has emptied 1/N of the workpieces in its first carrier. The third workpiece handling system begins after the first workpiece handling system has emptied 2/N of the workpieces in the first carrier. This continues until all N workpiece handling systems are operating. In this embodiment, the stocker robot must exchange a workpiece carrier every 3/N minutes, assuming that a workpiece carrier is emptied in 3 minutes, as described above.

Thus, a workpiece handling system that includes three conveyor belts is disclosed. Each of the three conveyor belts is capable of operating as a loading belt and an unloading belt, and therefore the direction of travel of the belt can be changed as required. In addition, each conveyor belt has an associated indexer. This indexer is used to index the workpiece carrier to allow the filling and emptying of workpieces from the workpiece carrier.

A controller (not shown) may be used to control the operation of the workpiece handling system. The controller may include a storage device, used to contain the instructions used to perform the sequences described in FIGS. 2-16. In some embodiments, the controller is used to control the operation of a plurality of workpiece handling systems. In some embodiments, the controller may also control the operation of one or more stocker robots 107. In a particular example, the controller may control the operation of more than one workpiece handling systems which all utilize a single stocker robot.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece handling system, comprising:
   three conveyer belts;
   three indexers, each associated with a respective conveyor belt, each adapted to hold a workpiece carrier; and
   a stocker robot to exchange a workpiece carrier disposed on one of said indexers;
   wherein a direction of travel for each of said three conveyor belts can be changed, allowing each of said conveyor belts to operate, at different times, as a loading belt and as a unloading belt and wherein at a particular time, a first conveyor belt operates as a loading belt, a second conveyor belt operates as an unloading belt, and said stocker robot exchanges a workpiece carrier disposed on an indexer associated with a third conveyor belt.

2. The workpiece handling system of claim 1, wherein said first conveyor belt operates as said unloading belt immediately after operating as said loading belt.

3. The workpiece handling system of claim 1, wherein said third conveyor belt operates as said loading belt after said first conveyor belt empties a workpiece carrier disposed on said associated indexer.

4. The workpiece handling system of claim 1, comprising exactly three conveyor belts.

5. A method of handling workpieces, comprising:
   placing a first workpiece carrier, filled with a first set of unprocessed workpieces, on a first indexer associated with a first conveyor belt;
   placing a second workpiece carrier, filled with a second set of unprocessed workpieces, on a second indexer associated with a second conveyor belt;
   removing said first set of workpieces from said first workpiece carrier and placing them on said first conveyor belt, where they are loaded into a processing system at a distal end of said first conveyor belt;
   receiving said first set of workpieces from said processing system at a distal end of said third conveyor belt;
   moving said first set of workpieces to said third indexer;
   filling a third workpiece carrier, disposed on a third indexer associated with said third conveyor belt, with said first set of workpieces;
   reversing a direction of travel of said first conveyor belt once a last workpiece has been removed from said first conveyor belt by said processing system;
   removing said second set of workpieces from said second workpiece carrier and placing them on said second conveyor belt, where they are loaded into said processing system at a distal end of said second conveyor belt;
   receiving said second set of workpieces from said processing system at a distal end of said first conveyor belt;
   moving said second set of workpieces to said indexer associated with said first conveyor belt; and
   filling said first workpiece carrier with said second set of workpieces.

6. The method of claim 5, further comprising:
   removing said third workpiece carrier from said third indexer after it is filled with said first set of workpieces; and
   placing a fourth workpiece carrier filled with a third set of unprocessed workpieces on said third indexer while said second set of workpieces is being processed.

7. The method of claim 6, further comprising:
   reversing a direction of travel of said second conveyor belt once a last workpiece has been removed from said second conveyor belt by said processing system;
   removing said third set of workpieces from said fourth workpiece carrier and placing them on said third conveyor belt, where they are loaded into a processing system at a distal end of said third conveyor belt;
   receiving said third set of workpieces from said processing system at a distal end of said second conveyor belt;

moving said third set of workpieces to said second indexer associated with said second conveyor belt; and filling said second workpiece carrier with said third set of workpieces.

8. The method of claim 7, further comprising:

removing said first workpiece carrier from said first indexer after it is filled with said second set of workpieces; and placing a fifth workpiece carrier filled with a fourth set of unprocessed workpieces on said first indexer while said third set of workpieces is being processed.

9. A workpiece handling system, comprising:

first, second and third conveyor belts;

three indexers, each associated with a respective conveyor belt, each adapted to hold a workpiece carrier; and a stocker robot to exchange a workpiece carrier disposed on one of said indexers; and a controller in communication with said conveyor belts, indexers and stocker robot, comprising a storage element comprising instructions which, when executed:

actuate said stocker robot to place a first workpiece carrier, filled with a first set of unprocessed workpieces, on a first indexer associated with said first conveyor belt;

actuate said stocker robot to place a second workpiece carrier, filled with a second set of unprocessed workpieces, on a second indexer associated with said second conveyor belt;

actuate said first conveyor belt in a direction of travel so as to operate as a loading belt;

actuate said indexer to remove said first set of workpieces from said first workpiece carrier and place them on said first conveyor belt, where they are loaded into a processing system at a distal end of said first conveyor belt;

actuate said third conveyor belt in a direction of travel so as to operate as an unloading belt;

receive said first set of workpieces from said processing system at a distal end of said third conveyor belt while said third conveyor belt is operating as an unloading belt;

actuate a third indexer associated with said third conveyor belt, to fill a third workpiece carrier, disposed on said third indexer, with said first set of workpieces;

reverse a direction of travel of said first conveyor belt once a last workpiece has been removed from said first conveyor belt by said processing system so as to operate as an unloading belt;

actuate said second conveyor belt in a direction of travel so as to operate as a loading belt;

actuate said second indexer to remove said second set of workpieces from said second workpiece carrier and place them on said second conveyor belt, where they are loaded into said processing system at a distal end of said second conveyor belt;

receive said second set of workpieces from said processing system at a distal end of said first conveyor belt while said first conveyor belt is operating as an unloading belt; and actuate said first indexer to fill said first workpiece carrier with said second set of workpieces.

10. The workpiece handling system of claim 9, wherein said storage element further comprises instructions which, when executed:

actuate said stocker robot to remove said third workpiece carrier from said third indexer after it is filled with said first set of workpieces; and actuate said stocker robot to place a fourth workpiece carrier filled with a third set of unprocessed workpieces on said third indexer while said second set of workpieces is being processed.

11. The workpiece handling system of claim 10, wherein said storage element further comprises instructions which, when executed:

reverse a direction of travel of said second conveyor belt once a last workpiece has been removed from said second conveyor belt by said processing system so as to operate as an unloading belt;

actuate said third conveyor belt in a direction of travel so as to operate as a loading belt;

actuate said third indexer to remove said third set of workpieces from said fourth workpiece carrier and place them on said third conveyor belt, where they are loaded into a processing system at a distal end of said third conveyor belt;

receive said third set of workpieces from said processing system at a distal end of said second conveyor belt while said second conveyor belt is operating as an unloading belt; and actuate said second indexer to fill said second workpiece carrier with said third set of workpieces from said second conveyor belt.

12. The workpiece handling system of claim 11, wherein said storage element further comprises instructions which, when executed:

actuate said stocker robot to remove said first workpiece carrier from said first indexer after it is filled with said second set of workpieces; and actuate said stocker robot to place a fifth workpiece carrier filled with a fourth set of unprocessed workpieces on said first indexer while said third set of workpieces is being processed.

* * * * *